(12) United States Patent
Wu et al.

(10) Patent No.: US 9,041,157 B2
(45) Date of Patent: May 26, 2015

(54) METHOD FOR DOPING AN ELECTRICALLY ACTUATED DEVICE

(75) Inventors: Wei Wu, Palo Alto, CA (US); Sagi Varghese Mathai, Palo Alto, CA (US); Shih-Yuan (SY) Wang, Palo Alto, CA (US); Jianhua Yang, Palo Alto, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 526 days.

(21) Appl. No.: 13/130,808

(22) PCT Filed: Jan. 14, 2009

(86) PCT No.: PCT/US2009/031010
§ 371 (c)(1),
(2), (4) Date: May 24, 2011

(87) PCT Pub. No.: WO2010/082926
PCT Pub. Date: Jul. 22, 2010

(65) Prior Publication Data
US 2011/0260135 A1    Oct. 27, 2011

(51) Int. Cl.
| | |
|---|---|
| *H01L 21/02* | (2006.01) |
| *H01L 29/02* | (2006.01) |
| *H01L 21/20* | (2006.01) |
| *H04Q 3/52* | (2006.01) |
| *B82Y 10/00* | (2011.01) |
| *H01L 45/00* | (2006.01) |
| *H01L 27/24* | (2006.01) |

(52) U.S. Cl.
CPC ............... *H04Q 3/521* (2013.01); *B82Y 10/00* (2013.01); *H01L 45/08* (2013.01); *H01L 45/1233* (2013.01); *H01L 45/145* (2013.01); *H01L 45/146* (2013.01); *H01L 45/1641* (2013.01); *H04Q 2213/13003* (2013.01); *H04Q 2213/1302* (2013.01); *H04Q 2213/1304* (2013.01); *H01L 27/2463* (2013.01)

(58) Field of Classification Search
CPC . H01L 45/1233; H01L 45/145; H01L 45/146; H01L 45/1641; H01L 45/08; H01L 21/2254; H01L 21/2256; H01L 27/10; H01L 27/2463; H01L 29/0673; H01L 29/0665
USPC ............. 257/1, 2, 3, 4, 5, 209, 529, 530, 607, 257/E45.002, E45.003, E27.004, E21.135, 257/E21.158, E29.109; 365/148, 163, 175, 365/178; 977/749, 779, 762
See application file for complete search history.

(56) References Cited

U.S. PATENT DOCUMENTS

| | | |
|---|---|---|
| 5,412,231 A | 5/1995 | Furuya |
| 5,997,638 A | 12/1999 | Copel et al. |

(Continued)

FOREIGN PATENT DOCUMENTS

WO    WO 2010050937 A1 *  5/2010  .............. H01L 27/10

OTHER PUBLICATIONS

Y. Liu, et al., "Charging effect of Al2O3 thin films containing Al nanocrystals", Applied Physics Letters 93, 142106 (2008).

*Primary Examiner* — Chuong A Luu
*Assistant Examiner* — Moazzam Hossain
(74) *Attorney, Agent, or Firm* — Hewlett-Packard Patent Department

(57) ABSTRACT

An electrically actuated device comprises an active region disposed between a first electrode and a second electrode, a substantially nonrandom distribution of dopant initiators at an interface between the active region and the first electrode, and a substantially nonrandom distribution of dopants in a portion of the active region adjacent to the interface.

15 Claims, 2 Drawing Sheets

(56) References Cited

U.S. PATENT DOCUMENTS

| | | |
|---|---|---|
| 7,220,983 B2 | 5/2007 | Lung |
| 2005/0006640 A1 | 1/2005 | Jackson |
| 2008/0079029 A1 | 4/2008 | Williams |
| 2008/0232154 A1 | 9/2008 | Kinoshita |
| 2008/0239797 A1 | 10/2008 | Tsukamoto et al. |
| 2008/0265235 A1 | 10/2008 | Kamigaichi et al. |

* cited by examiner

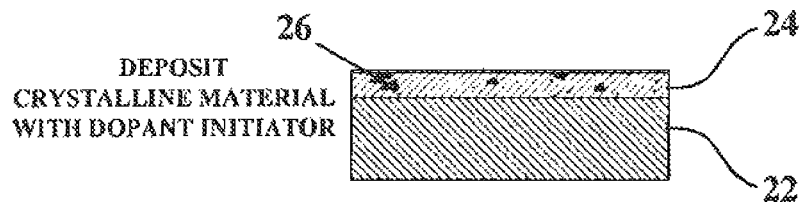
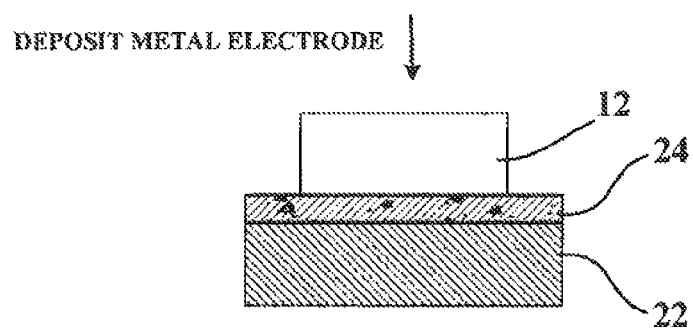
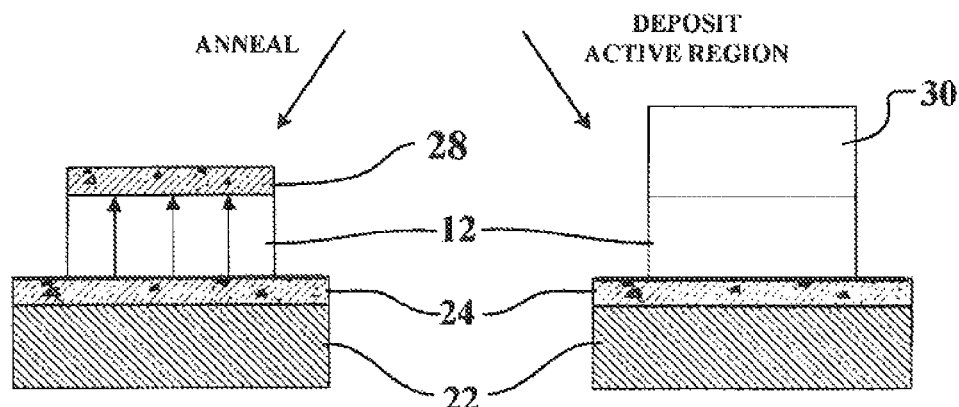
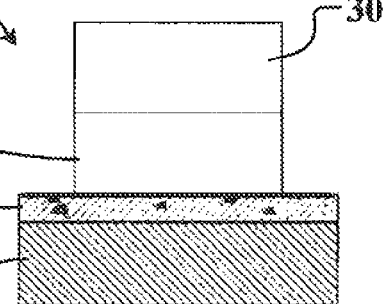
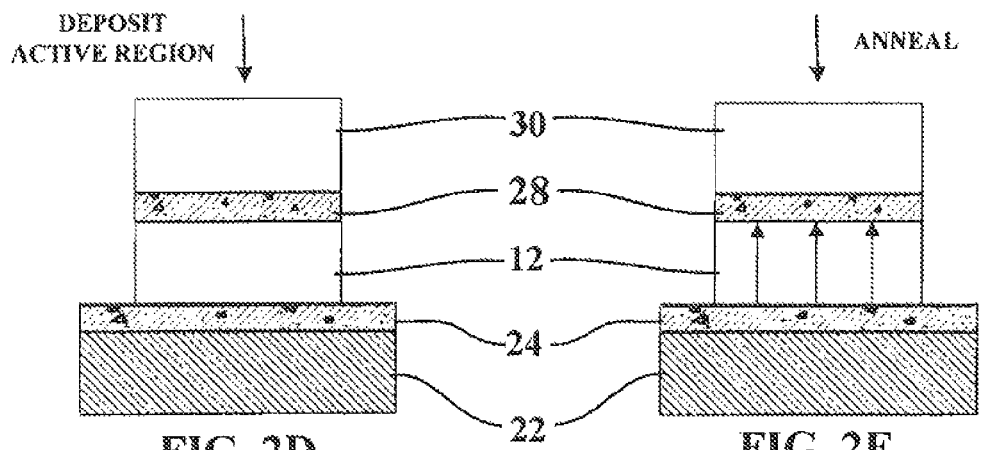

METHOD FOR DOPING AN ELECTRICALLY ACTUATED DEVICE

BACKGROUND

Nanometer-scale crossed-wire switching devices have been reported that can be switched reversibly and exhibit an ON-to-OFF conductance ratio of about $10^3$. Such devices have been used to construct crossbar circuits and provide a promising route for the creation of ultra-high density non-volatile memory. A series connection of crossed-wire switches has been used to construct a latch, which is an important component of logic circuits and for communication between logic and memory. New logic families constructed from crossbar arrays of switches have the potential to dramatically increase the computing efficiency of CMOS circuits. Continuing development of fabrication processes can increase production yield and provide devices with consistent characteristics.

BRIEF DESCRIPTION OF THE DRAWINGS

FIGS. 2A through 2D are schematic views depicting an embodiment of the method for doping an electrically actuated switch; and FIGS. 2E through 2F are schematic views depicting another embodiment of the method for doping an electrically actuated switch.

DETAILED DESCRIPTION OF EXAMPLE EMBODIMENTS

Figure 1A:
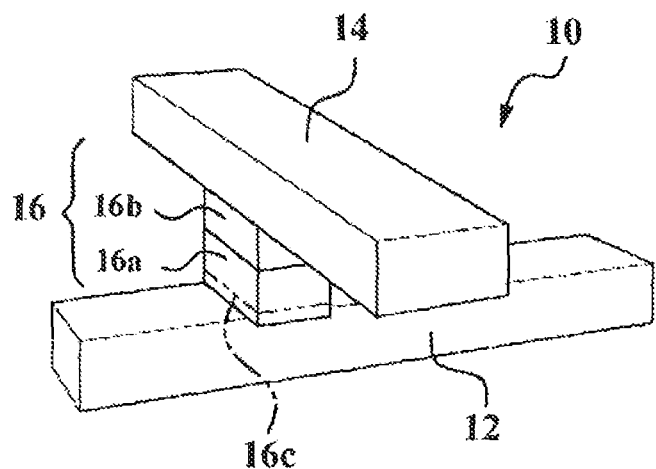
FIG. 1A is a perspective view of an embodiment of a solid state electrically actuated switch connecting two different crossed wires.

Features and advantages of the invention will be apparent from the detailed description which follows, taken in conjunction with the accompanying drawings, which together illustrate, by way of example, features of the invention. For the sake of brevity, reference numerals having a previously described function may or may not be described in connection with subsequent drawings in which they appear.

Electrically actuated switches can include an active region situated between two wires. In many cases, both wires include a conductive metal such as platinum. The active region can comprise a material that is a weak ionic conductor as well as being either an electronic semiconductor or nominally insulating. More particularly, it can be a material that is capable of transporting and hosting ions that act as dopants to control the flow of electrons through the switch. At least one portion of the active region serves as a dopant source or sink and includes one or more species of dopants that are capable of drifting into intrinsic regions of the material under a suprathreshold bias voltage. Such dopants can include mobile charged dopants such as vacancies, interstitials, and other charged impurities.

Applying a sufficiently high forward bias voltage (e.g. 0.1 V to 10.0 V) to the electrodes causes both ion current and electron current to flow in the switch. Dopant ions move into the intrinsic active material, resulting in a significant decrease in resistance of the switch. The active region material and dopants are chosen such that the flow into or out of the active material is possible, but not too facile. This is to ensure that the switch is nonvolatile, i.e. it will remain in whatever state it is set for a reasonably long time. At a low bias the flow of ion current is negligible, which allows the switch to hold its resistance. The switch is also reversible, in that a sufficient reverse bias voltage (e.g. −0.1 to −10.0 V) drives the dopants back out of the switching region and resistance increases as the active material approaches its previous intrinsic state.

Figure 1B:
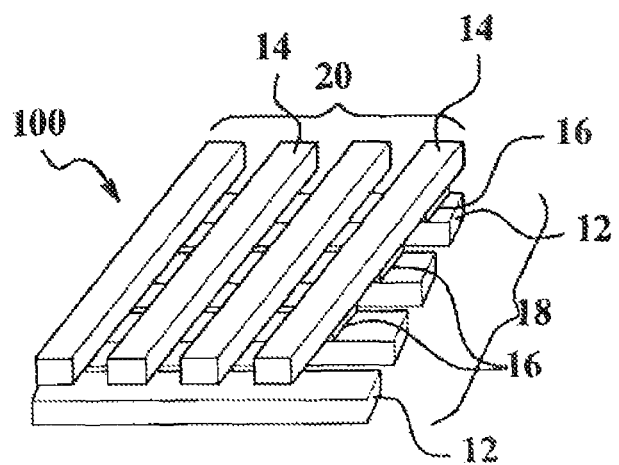
FIG. 1B is a perspective view of an array of the switches of FIG. 1.

FIGS. 1A and 1B illustrate an example of a solid-state electrically actuated switch 10 and cross-bar array 100. In FIG. 1A, two different crossed wires or electrodes 12, 14 have a switch junction 16 therebetween. The switch junction includes a primary active region 16a and a secondary active region 16b. The secondary active region is a material that acts as a source and sink of the dopants. As shown in FIG. 1A, the switch junction may also include a molecular layer 16c as a non-covalently bonded interface, where the molecular layer includes molecules that may or may not be switchable by the bias voltage. One or both wires may be of metal, metallic compounds, or semiconductor materials. In some instances, both wires or electrodes are metal.

A crossbar array 100 may also be formed including a plurality of the solid-state electrically actuated switches 10 shown in FIG. 1A. As shown in FIG. 1B, a first layer 18 of approximately parallel wires 12 is overlaid with a second layer 20 of approximately parallel wires 14. The second layer is roughly perpendicular in orientation to the wires of the first layer. It is to be understood, however, that the orientation angle between the layers may vary. The wires and switches of such devices may be fabricated on a micron, submicron, or nanometer scale, depending on the application.

Although individual wires in the figures are shown with square or rectangular cross-sections, wires may also have circular, elliptical, or more complex cross-sections. The wires may also have many different widths or diameters and aspect ratios or eccentricities. The term "nanowire crossbar" may refer to crossbars having one or more layers of sub-microscale wires, microscale wires or wires with larger dimensions in addition to nanowires.

Such switches may be used as the basis for memories (e.g., the storage of a bit of information, 1 or 0), for a closed or open switch in a cross-point memory, for configuration bits in a logic circuit that resembles a Field Programmable Gate Array, or as the basis for a wired-logic Programmable Logic Array. These switches also find uses in a wide variety of other applications.

Conventional fabrication methods for such devices often involve depositing a metal for a first electrode onto an amorphous substrate, such as silica ($SiO_2$). At this stage a dopant-rich material (or one that includes dopant initiators) may be added as a layer. As used herein, the term "dopant initiator" generally refers to a substance that is capable of providing dopants to an active region material. In some instances, the dopant initiator may include a substance that is itself a suitable dopant for the active region material. In other instances, dopant initiators form dopants by chemically reacting with the active material. One example is a layer of aluminum added to a layer of titanium dioxide, where the aluminum serves as a dopant initiator by reducing a portion of the titanium dioxide to create oxygen vacancies that serve as dopants. As discussed above, dopants that move into the active material establish localized conductance channels, or switching centers, that collectively diminish the tunneling barrier across the material. The distribution of these switching centers across the active region can be at least partly due to the distribution of dopants or dopant initiators in the dopant layer. However, in applying the dopant layer, the eventual distribution of dopants in the layer may not be entirely predictable. An uneven distribution of dopants, and therefore switching centers in the actuated device, may raise concerns about device performance. One particular concern may be the generation of "hot spots" arising from a higher concentration of switching in certain areas of the device.

Embodiments of the present invention provide methods for fabricating electrically actuated switches that have a substantially nonrandom distribution of dopants. This in turn can produce a more uniform distribution of switching centers during actuation. Such switches may exhibit more uniform switching behavior, with fewer switching "hot spots". This approach can therefore result in a higher yield of nanoscale devices based on these switches.

FIGS. 2A-F illustrate fabrication of electrically actuated switches in accordance with embodiments of the present invention. Referring to FIG. 2A, a substrate 22 is prepared that includes a crystalline material. The substrate may be any desirable crystalline material including, but not limited to, semiconductor materials. In a particular embodiment, the crystalline material is based on materials found in Groups of the periodic table. In a more particular embodiment, the crystalline material is gallium arsenide. Other non-limiting examples include indium phosphide, gallium nitride, silicon germanium, zinc selenide, zinc oxide, graphene carbon, chalcogenide phase change material (in either crystalline or amorphous state), metal hydrides, and hybrids and combinations of any of these materials. In a further operation, a layer 24 of a second crystalline material containing dopant initiators 26 is deposited onto the crystalline substrate, where the second crystalline material has a different lattice constant from that of the substrate material. A lattice mismatch arising from such a difference can prevent the formation of a defect-free epitaxial layer. More specifically, lattice mismatch introduces elastic strain in the resulting crystalline structure. This strain depends in part on the magnitude of the mismatch (i.e. the difference between the lattice constants). Once a certain critical strain is reached, it can no longer be accommodated by the lattice structure. Rather, the stress is released by the formation of misfit dislocations which disrupt the structure.

Lattice matching is difficult to achieve in heteroepitaxial deposition. At the same time, deformations in monocrystalline layers are undesirable for many applications. In these cases, strain arising from lattice mismatches can be reduced by carefully choosing materials and keeping the thickness of the deposited materials below the critical thickness ($h_c$) for a given mismatch. However, the present method actually makes use of the effects of elastic strain arising from lattice mismatch to improve device yield and quality.

The dopant initiator layer 24 in FIG. 2A may be deposited by methods known in the art for creating crystalline layers, such as molecular beam epitaxy or other crystal growth techniques such as chemical vapor deposition (CVD), pulsed laser deposition (PLD), sputtering, or atomic layer deposition (ALD). In one approach, chalcogenide phase change material can be used. The chalcogenide material can be first deposited in an amorphous state, and then converted to a crystalline state by applying a heat pulse and then cooling gradually. This can be done using a rapid thermal annealer or alternatively, it can be accomplished at individual crosspoints by applying a current pulse.

The thickness of this layer depends at least in part, on the amount of dopant initiator 26 that is desired to be available to provide dopants to the active region. Generally, the thicker the layer, the more dopant that can be provided to the active region and therefore the lower the device resistances that can be achieved. However, the thickness of the layer may also be determined by the amount of lattice mismatch, or more particularly by the elastic layer stress that is needed to provide desired strain-related phenomena in the lattice mismatch. Therefore, in a specific embodiment, the layer is applied at a thickness that is greater than the critical thickness for the lattice mismatch.

The dopants employed in the embodiments disclosed herein may be hydrogen, alkali, and alkaline earth cations, transition metal cations, rare earth cations, as well as anions or vacancies of oxygen, chalcogenides, nitrogen, pnictides, or halides. Such charged dopants are formed via the chemical reaction of dopant initiators with the active region. As such, dopant initiators can be chosen that will produce the desired dopant upon reacting with a particular active region material. Non-limiting examples of dopant initiator/active region combinations include $Ti/TiO_2$, $Zr/ZrO_2$, $Hf/HfO_2$ (each of which can produce oxygen vacancies or metal interstitials); Ga/GaN (to produce nitrogen vacancies); and S/GaN (to produce sulfide ions).

As shown in FIG. 2B, a metal electrode 12 can then be deposited onto the dopant initiator containing crystalline layer 24 to serve as the first electrode of the device. The electrode may be fabricated on the dopant initiator containing crystalline layer using conventional techniques such as photolithography or electron beam lithography, or by more advanced techniques such as imprint lithography. In one embodiment, the thickness of the electrode ranges from about 5 nm to about 100 nm. The thickness may be varied depending, at least in part, on the desired diffusion properties and the thickness of the dopant initiator layer 24. The electrode may be any suitable conductive material, such as gold, platinum, tungsten, silver, or copper.

In order to bring the dopant initiators into a position to dope an active region of the switch, at least a portion of the dopant initiators may be caused to move through the metal so as to be available on a surface of the electrode. In one embodiment, the dopants move to the surface that is opposite to the dopant-containing crystalline layer. In a particular aspect, this surface is the upper surface of the electrode during fabrication. The dopant initiators are then brought into contact with active region material so that doping of said material may be possible.

FIGS. 2C-2D and FIGS. 2E-2F illustrate two different approaches by which these operations may be achieved. In one particular embodiment, the dopant initiators 26 are made to move through the electrode 12 before any further deposition operations are carried out. In a more particular embodiment shown in FIG. 2C, this operation is accomplished by annealing the metal electrode 12 with the dopant-containing crystalline layer 24 so that dopant initiators diffuse up through the metal and form deposited dopant initiators 28 on the upper surface. The active region 30 is then deposited onto the available dopant initiators as shown in FIG. 2D.

The active region 30 is also a thin film (e.g., equal to or less than 500 nm) of a material suitable for such devices as described above, i.e. a weak ionic conductor with electronically insulating or electronically semiconducting properties. It is to be understood that the definition of weak ionic conductor depends upon the application for which the device is designed, or more particularly, upon the desired level of state stability for the application. The mobility and diffusion constant for a dopant in a lattice are directly proportional to one another as expressed by the "Einstein relation". Thus, if the mobility of ionized dopants in a lattice is very high, so is the diffusion constant. Generally, it is desired that a device be able to stay in a particular state for an extended period of time which may depend on the application. The diffusion constant of such a device may be low enough to ensure the desired level of stability. Therefore, a "weak ionic conductor" is one in which the ion mobility, and thus the diffusion constant, is small enough to ensure the stability of the state of the device for as long as necessary under a given set of conditions.

Non-limiting examples of suitable materials for the active region 30 (FIG. 2D) include oxides, sulfides, selenides, nitrides, phosphides, arsenides, chlorides, and bromides of silicon, transition metals, rare earth metals, or alkaline earth metals. Further various alloys of like compounds may be used if they are mutually soluble. There are also mixed compounds in which two, three, or more different metal atoms are combined with some number of electronegative elements. Materials including the elements Ti, Zr, and Hf (e.g. titania, zirconia, and hafnia) are particularly attractive because they can be compatible with Si integrated circuit technology, as all of these have the same primary oxidation state (+4). As such, these elements would not create unintentional doping of the Si. Further possible compounds include alloys of titania, zirconia, and hafnia, and compounds that combine Ti with other divalent elements (e.g. Sr, Mg, Ca, Cd, Zn). It is also possible to use alloys of these various compounds such as $Ca_aSn_bBa_cTi_xZr_yHf_xO_3$, where a+b+c=1 and x+y+z=1. It is to be further understood that the active region may include sublayers of different materials or compounds chosen from the above examples.

Suitable deposition techniques include conventional physical and chemical techniques, including evaporation from a Knudsen cell, electron beam from a crucible, sputtering from a target, electron beam evaporation, CVD, molecular beam epitaxy, atomic layer deposition, or various other forms of chemical vapor or beam growth from reactive precursors.

In another embodiment, the active region 30 is deposited directly onto the electrode 12 as shown in FIG. 2E. Then the electrode and dopant-containing crystalline layer 24 are annealed so that at least some of the dopant initiators diffuse to the interface between the electrode and the active region.

In still another embodiment of the process, the operation of causing diffusion is accomplished through depositing the active region using a hot deposition process, during which the electrode and underlying layers are exposed to enough heat to cause the dopant initiators to diffuse through the electrode.

In each of these heat-induced diffusion techniques, the temperature used is sufficient to cause some or all of the dopant initiators in the dopant initiator containing layer to diffuse through the adjacent electrode to a surface thereof. By adjusting the temperature, the kinetics of diffusion may be controlled, and desirable diffusion of the dopant initiator may be achieved. The temperature and time for exposure to such temperature may depend, at least in part, on the amount of dopant initiator to be diffused and the thickness of the layers involved. In one example, the temperature ranges from about 200° C. to about 400° C. Furthermore, the gain boundaries in the electrode may be selected so as to achieve desirable diffusion kinetics.

A particular feature of the method embodied here is that the resulting distribution of dopants or dopant initiators is substantially nonrandom, particularly as compared to fabricating a similar device through a similar processes using an amorphous dopant film on an amorphous substrate. As described above, the mismatch between lattice structures in the substrate and dopant-containing layer gives rise to strain at the interface between the materials. Given the regular pattern of each material's lattice, the strain between them can be expected to vary in a patterned way across the interface. When the strain is sufficient to cause dislocations; these too may form a patterned disruption of the overlying crystal layer. Accordingly, in a particular aspect of the invention, a nonrandom topography exists in the dopant-containing crystalline layer and extends across said layer. In a more particular aspect, the nonrandom topography is present across the upper surface of the dopant-containing crystalline layer.

Without being bound to a particular theory, it is believed that the nonrandom topography may arise through modes of film growth that are Characterized by "islanding," where the deposited layer becomes divided into islands of crystallinity. Examples of such modes are Volmer-Weber and Stranski-Krastanov growth modes, with the latter mode particularly occurring where lattice strain disrupts orderly growth in a thickening crystal layer. In one embodiment, the nonrandom topography of the dopant-containing crystalline layer includes islands of the crystalline material.

The second crystalline material may be chosen for its lattice constant, so as to provide a desired magnitude of lattice mismatch relative to the substrate material. In turn, the desired degree of mismatch may depend on the layer thickness the application calls for, as the critical thickness above which lattice strain is likely to cause dislocations is proportional to the lattice mismatch. Conversely, a desired thickness of dopant layer may be determined by the mismatch presented by the chosen combination of crystalline materials.

In view of the above, it can be seen that a patterned disruption of the dopant-containing layer may also provide a structure in which the distribution of dopants or dopant initiators also varies according to the pattern. For example, a misfit dislocation network in a dopant-containing crystalline layer may cause a corresponding network of varying dopant density. Similarly, where such a layer exhibits patterned islanding, the islands may exhibit either a higher or a lower dopant density than the surrounding material. As such, this topography may also affect how the dopants or dopant initiators move through the metal of the electrode, and therefore the distribution of dopant or dopant initiator on the electrode surface. Without being bound to a particular theory, the patterning of dopant distribution in the crystalline layer may be maintained to some degree during diffusion, so that some degree of the order in the distribution is reflected in the distribution on the electrode surface. Accordingly in one aspect, a nonrandom distribution of dopants or dopant initiator on the electrode surface arises from the nonrandom topography in the dopant-containing layer. In a more particular aspect the nonrandom distribution includes localized, non-continuous clusters of dopants or dopant initiators. Alternatively, the nonrandom distribution of dopants or dopant initiators in the dopant-containing layer may serve to make the distribution of dopants or dopant initiators on the electrode more uniform, so that dopant density is substantially constant across the entire area.

In a more particular embodiment, the nonrandom topography of the dopant-containing crystalline film may also affect the structure of the metal electrode, either as it is deposited or during annealing. For example, the topography of the crystalline layer can create a complementary topography on the bottom surface of the electrode, and this may make a more uniform diffusion and distribution of dopant or dopant initiators more likely. Furthermore, this topography may be reflected in altered grain boundary patterns in the metal of the electrode.

Through the methods described above, electrically actuated switches can be made in which dopant distribution is more uniform. Such devices exhibit doping of the active region material that is free of excessively doped or minimally doped areas. Application of a threshold bias voltage to the device induces dopants to drift into the active region and establish switching centers that are more uniformly and predictably located. During normal operation, current flux through the switch is evenly distributed, and this avoids excessive current densities that may damage the switch or lead to other kinds of circuit failure. In accordance with the present invention an electrically actuated device can comprise at least a first electrode and a second electrode with an active region disposed between them, a substantially nonrandom distribution of dopants in the active region adjacent to one of the electrodes. In a more specific embodiment, the active region comprises titania, hafnia, or zirconia, or is an alloy or compound based on a combination of two or more of these materials. In another embodiment, chalcogenide material can also be used with ion migration for changing the conductivity of the switching layer. Chalcogenide offers both an amorphous and crystalline state to further allow more latitude adjusting the conductivity of the switching layer.

Summarizing and reiterating to some extent, a method of forming electrically actuated devices has been invented which provide more uniform and effective switching properties. The method can include forming such devices on two lattice-mismatched crystalline layers. In particular, devices with more uniform spatial distribution of dopants are provided relative to the devices of the prior art. Increased yield in device fabrication may result.

While the forgoing exemplary embodiments are illustrative of the principles of the present invention in one or more particular applications, it will be apparent to those of ordinary skill in the art that numerous modifications in form, usage and details of implementation can be made without the exercise of inventive faculty, and without departing from the principles and concepts of the invention. Accordingly, it is not intended that the invention be limited, except as by the claims set forth below.

What is claimed is:

1. An electrically actuated device comprising
a substrate comprising a first crystalline material;
a dopant initiator layer on the substrate, the dopant initiator layer comprising a second crystalline material, the dopant initiator layer having a thickness greater than a critical thickness for a lattice mismatch between the substrate and the dopant initiator layer, the dopant initiator layer comprising a nonrandom topography across an upper surface of the dopant initiator layer;
a first electrode on the dopant initiator layer;
a second electrode;
an active region disposed between the first electrode and second electrode;
a substantially nonrandom distribution of dopant initiators at an interface between the active region and the first electrode arising from the nonrandom topography across the upper surface of the dopant initiator layer; and
a substantially nonrandom distribution of dopants in a portion of the active region adjacent to the interface between the active region and the first electrode.

2. The electrically actuated device of claim 1, wherein the substantially nonrandom distribution of dopants is formed by annealing the first electrode with a layer of crystalline material containing dopant initiators, said crystalline material being nonrandomly distributed across the layer.

3. The electrically actuated device of claim 1, wherein the nonrandom distribution of dopant initiators includes localized, non-continuous clusters of dopant initiators.

4. The electrically actuated device of claim 1, wherein the nonrandom distribution of dopant initiators comprises a substantially constant density of dopant initiators throughout the interface.

5. A method for doping an electrically actuated device, comprising:
preparing a substrate comprising a first crystalline material;
depositing on the substrate a layer of a second crystalline material containing dopant initiators, wherein:
the second crystalline material has a lattice constant different from that of the first crystalline material;
the layer of the second crystalline material is deposited to a thickness that is greater than a critical thickness for a lattice mismatch between the first crystalline material and the second crystalline material; and
a nonrandom topography is created across an upper surface of the layer of the second crystalline material due to the lattice mismatch;
depositing the first electrode on the layer of the second crystalline material; and
causing at least a portion of the dopant initiators to move through the first electrode to an opposing surface of the first electrode, thereby forming a nonrandom distribution of dopant initiators on the opposing surface, wherein the opposing surface serves as the interface between the first electrode and an active region and the dopant initiators are configured to form dopants in a portion of the active region.

6. The method of claim 5, wherein the nonrandom topography includes islands comprising the second crystalline material.

7. The method of claim 5, wherein the active region is deposited onto the nonrandom distribution of dopant initiators after causing at least a portion of the dopants or dopant initiators to move through the first electrode to the opposing surface of the first electrode.

8. The method of claim 5, wherein the active region is deposited onto the metal electrode before causing at least a portion of the dopant initiators to move through the first electrode to the opposing surface of the first electrode.

9. The method of claim 5, wherein the nonrandom distribution includes localized, non-continuous clusters of dopant initiators.

10. The method of claim 5, wherein the nonrandom distribution comprises a substantially constant density of dopant initiators across the opposing surface.

11. The method of claim 5, wherein causing at least a portion of the dopant initiators to move through the first electrode is accomplished by annealing the first electrode and the second crystalline material, thereby diffusing a portion of the dopant initiators to the opposing surface of the first electrode.

12. The method of claim 5, wherein causing at least a portion of the dopant initiators to move through the first electrode is accomplished by hot deposition of the active region onto the first electrode, in which sufficient heat is applied to the first electrode and the second crystalline material to diffuse a portion of the dopant initiators to the opposing surface of the first electrode.

13. The method of claim 5, wherein the dopants are selected from the group consisting of charged vacancies, anions, cations, or combinations thereof.

14. A method for doping the electrically actuated device of claim 1, comprising:
preparing a substrate comprising a first crystalline material;
depositing on the substrate a layer of a second crystalline material containing dopant initiators, wherein the second crystalline material has a lattice constant different from that of the first crystalline material;
depositing the first electrode on the layer of second crystalline material; and causing at least a portion of the dopant initiators to move through the first electrode to an opposing surface of the first electrode, thereby forming a nonrandom distribution of dopant initiators on the opposing surface, wherein:
- the opposing surface serves as the interface between the first electrode and the active region;
- the dopant initiators are configured to form dopants in a portion of the active region; and
- the nonrandom distribution of dopant initiators comprises a uniform distribution of dopant initiators.

15. An electrically actuated device comprising
a first electrode;
a second electrode;
an active region disposed between the first electrode and second electrode;
a substantially nonrandom distribution of dopant initiators at an interface between the active region and the first electrode, wherein the nonrandom distribution of dopant initiators or dopants comprises a uniform distribution of dopant initiators or dopants; and
a substantially nonrandom distribution of dopants in a portion of the active region adjacent to the interface between the active region and the first electrode.

* * * * *